United States Patent
Kinoshita et al.

(10) Patent No.: US 9,768,260 B2
(45) Date of Patent: Sep. 19, 2017

(54) FABRICATION METHOD OF SILICON CARBIDE SEMICONDUCTOR APPARATUS AND SILICON CARBIDE SEMICONDUCTOR APPARATUS FABRICATED THEREBY

(71) Applicant: FUJI ELECTRIC CO., LTD., Kawasaki-shi, Kanagawa (JP)

(72) Inventors: Akimasa Kinoshita, Tsukuba (JP); Takashi Tsuji, Tsukuba (JP); Kenji Fukuda, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/388,729

(22) PCT Filed: Mar. 14, 2013

(86) PCT No.: PCT/JP2013/057314
§ 371 (c)(1),
(2) Date: Sep. 26, 2014

(87) PCT Pub. No.: WO2013/146328
PCT Pub. Date: Oct. 3, 2013

(65) Prior Publication Data
US 2015/0056786 A1    Feb. 26, 2015

(30) Foreign Application Priority Data
Mar. 30, 2012    (JP) ................. 2012-082041

(51) Int. Cl.
*H01L 29/45*    (2006.01)
*H01L 21/28*    (2006.01)
(Continued)

(52) U.S. Cl.
CPC .... *H01L 29/1608* (2013.01); *H01L 21/02529* (2013.01); *H01L 21/02609* (2013.01);
(Continued)

(58) Field of Classification Search
CPC .......... H01L 21/0485; H01L 21/02068; H01L 29/1608; H01L 29/45
(Continued)

(56) References Cited

U.S. PATENT DOCUMENTS 5,442,200 A  * 8/1995 Tischler .......................... 257/77
6,468,890 B2 * 10/2002 Bartsch et al. ............... 438/597
(Continued)

FOREIGN PATENT DOCUMENTS

| JP | 9-52796 A | 2/1997 |
|---|---|---|
| JP | 2003-243323 A | 8/2003 |

(Continued)

OTHER PUBLICATIONS

Notification of Transmittal of Translation of the International Preliminary Report on Patentability (Chapter I or Chapter II) (Form PCT/IB/338) of the International Application No. PCT/JP2013/057314 mailed Oct. 9, 2014, with Forms PCT/IB/326, PCT/IB/373, and PCT/ISA/237; w/English Translation. (18 pages).
(Continued)

*Primary Examiner* — Mary Wilczewski
(74) *Attorney, Agent, or Firm* — Westerman, Hattori, Daniels & Adrian, LLP

(57) ABSTRACT

Process (A) of preparing a silicon carbide substrate of a first conductivity type; process (B) of forming an epitaxial layer of the first conductivity type on one principal surface of the silicon carbide substrate; process (C) of forming on another principal surface of the silicon carbide substrate, a first metal layer; process (D) of heat treating the silicon carbide substrate after the process (C) to form an ohmic junction between the first metal layer and the other principal surface of the silicon carbide substrate, and a layer of a substance (10) highly cohesive with another metal on the first metal layer; and a process (E) of removing impurities and cleaning
(Continued)

a surface of the first metal layer (8) on the other principal surface of the silicon carbide substrate (D), are performed. The heat treatment at process (D) is executed at a temperature of 1,100 degrees C. or more.

19 Claims, 6 Drawing Sheets

(51) Int. Cl.
*H01L 29/16* (2006.01)
*H01L 21/04* (2006.01)
*H01L 29/47* (2006.01)
*H01L 29/872* (2006.01)
*H01L 29/66* (2006.01)
*H01L 21/02* (2006.01)

(52) U.S. Cl.
CPC ...... *H01L 21/0485* (2013.01); *H01L 21/0495* (2013.01); *H01L 29/45* (2013.01); *H01L 29/47* (2013.01); *H01L 29/6606* (2013.01); *H01L 29/66227* (2013.01); *H01L 29/872* (2013.01); *H01L 21/02068* (2013.01)

(58) Field of Classification Search
USPC .......................................................... 438/602
See application file for complete search history.

(56) References Cited

U.S. PATENT DOCUMENTS

| | | | | |
|---|---|---|---|---|
| 6,599,644 | B1* | 7/2003 | Zekentes et al. | 428/627 |
| 6,759,683 | B1* | 7/2004 | Cole et al. | 257/77 |
| 7,163,882 | B1* | 1/2007 | Cole et al. | 438/597 |
| 7,790,616 | B2* | 9/2010 | Buchoff et al. | 438/682 |
| 7,875,545 | B2* | 1/2011 | Ward et al. | 438/602 |
| 2006/0273323 | A1 | 12/2006 | Yamamoto et al. | |
| 2007/0138482 | A1* | 6/2007 | Tanimoto | 257/77 |
| 2009/0098719 | A1 | 4/2009 | Matsuno et al. | |
| 2009/0269908 | A1 | 10/2009 | Fujiwara et al. | |
| 2011/0233560 | A1* | 9/2011 | Koike et al. | 257/77 |
| 2014/0061674 | A1 | 3/2014 | Imai | |
| 2015/0024581 | A1* | 1/2015 | Imai | 438/571 |
| 2015/0056786 | A1* | 2/2015 | Kinoshita et al. | 438/478 |

FOREIGN PATENT DOCUMENTS

| | | |
|---|---|---|
| JP | 2006-332358 A | 12/2006 |
| JP | 2006-344688 A | 12/2006 |
| JP | 2009-94392 A | 4/2009 |
| JP | 2009-266969 A | 11/2009 |
| JP | 2012248729 A | 12/2012 |
| WO | 2010/134344 A1 | 11/2010 |
| WO | 2012/165513 A1 | 12/2012 |

OTHER PUBLICATIONS

Shenai et al., "Optimum Semiconductors for High-Power Electronics", IEEE Transactions on Electron Devices, vol. 36, No. 9, Sep. 1989, pp. 1811-1823.
International Search Report dated Jun. 18, 2013 issued in corresponding application No. PCT/JP2013/057314.
Office Action dated Apr. 12, 2016, issued in counterpart Japanese Patent Application No. 2012-082041, with partial English translation. (13 pages).
Office Action dated Mar. 30, 2016, issued in counterpart Chinese Patent Application No. 201380018092.X, with partial English translation. (17 pages).

* cited by examiner

US 9,768,260 B2

FABRICATION METHOD OF SILICON CARBIDE SEMICONDUCTOR APPARATUS AND SILICON CARBIDE SEMICONDUCTOR APPARATUS FABRICATED THEREBY

TECHNICAL FIELD

The present invention relates to a method of improving the cohesion of a deposited metal film for a fabrication method of a silicon carbide semiconductor apparatus, and particularly to a method of fabricating a silicon carbide semiconductor apparatus including a metal/silicon carbide semiconductor interface, and a silicon carbide semiconductor apparatus fabricated according to the method.

BACKGROUND ART

Silicon carbide (SiC) is a chemically highly-stable material having a wide band gap of 3 eV, and can be used extremely stably as a semiconductor even at high temperatures. The highest field intensity of silicon carbide is 10 fold higher than that of silicon (Si) and therefore, silicon carbide attracts attention as a material to replace silicon, which is currently at its performance limit, from the viewpoint of power semiconductor devices (see, e.g., Non-Patent Literature 1 below).

For a semiconductor apparatus, in the last stage of the fabrication process, a metal wiring film is formed to connect the semiconductor apparatus to an external apparatus. Many conditions are required for this metal wiring film such as low contact resistance, no peeling during dicing, and durability of the bonding/die bonding and the long term use after the bonding without any peeling. However, no peeling is especially required and the high cohesion is required. A silicon carbide semiconductor apparatus using silicon carbide as its material is no exception to the above.

A silicon carbide semiconductor apparatus using silicon carbide as its material tends to have a layer formed on a surface that induces peeling off such as a graphite layer because the silicon carbide includes carbon; many high temperature process steps are used to cause carbon to react with a metal in the process of fabricating (manufacturing) the semiconductor apparatus; and many process steps need to further be executed after the reactions. Therefore, the metal film for wiring, etc. is deposited on the layer inducing the peeling such as the graphite layer and therefore, the metal wiring film tends to peel off.

Noting especially the process of forming an ohmic electrode to establish a low resistance connection in the silicon carbide semiconductor apparatus, it has been reported that merely, a nickel (Ni) film has to be deposited on a silicon carbide substrate; and thereafter, for example, an Ni silicide film has to be formed on the silicon carbide substrate by executing a heat treatment for the deposited Ni film and the silicon carbide substrate to cause Ni in the Ni film to react with silicon in the silicon carbide substrate. However, when the heat treatment is executed for Ni to form the Ni silicide film, Ni does not react with carbon (C) in the silicon carbide substrate and therefore, the surplus carbon forms the graphite layer on the Ni silicide film. Because plural process steps are executed thereafter, contaminants degrading the cohesion are deposited on the ohmic electrode surface. When the metal wiring film for the connection to an external apparatus is fabricated on a surface having the contaminants deposited thereon, the cohesion therebetween is degraded and this becomes a factor to cause the metal wiring film to peel off.

Therefore, methods have been proposed of suppressing the peeling of the metal wiring film based on prevention of the peeling of the metal wiring film by removing the graphite layer formed on the surface of the Ni silicide film using a plasma process in an oxygen gas ($O_2$) atmosphere or an inert gas (argon (Ar), etc.) atmosphere (see, e.g., Patent Document 1 below); a method of causing the graphite layer to remain under the surface by forming an Ni silicide film on an Ni film in advance before heat treatment is executed for the Ni film deposited on the silicon carbide substrate (see, e.g., Patent Document 2); and a method of depositing a metal reactive with carbon on an Ni film, executing heat treatment therefor, and thereby, forming a metal carbide layer on the surface of the Ni film (see, e.g., Patent Document 3).

Patent Document 1: Japanese Laid-open Patent Publication No. 2003-243323
Patent Document 2: Japanese Laid-open Patent Publication No. 2006-332358
Patent Document 3: Japanese Laid-open Patent Publication No. 2006-344688
IEEE Transactions On Electron Devices (Vol. 36, p. 1811, 1989)

DISCLOSURE OF INVENTION

Problem to be Solved by the Invention

As described, many factors are present that cause the formation of a layer that becomes a substance causing peeling-off such as a graphite layer that causes the peeling-off of the metal wiring film in the fabrication process of the silicon carbide semiconductor apparatus. When the substance that causes peeling-off is removed using a physical method such as the argon (Ar) sputtering in Patent Document 1, etc., not only the substance causing peeling-off but also the Ni silicide layer necessary for the low resistance connection are removed. It is difficult to establish a method of accurately removing only the substance causing peeling-off. As to the method of removing the deposited graphite by executing heat treatment after depositing the metal that forms a compound with carbon as in Patent Document 3, etc., the process steps thereof can be simplified while the peeling off of the metal wiring film is inevitable, which is caused by contaminants generated at the process steps executed after the removal of the deposited graphite.

In view of the above problems, an object of the present invention is to provide a method of enabling suppression of peeling off of the metal wiring film based on a method of fabricating a semiconductor apparatus according to which: a metal film is deposited on a silicon carbide substrate; thereafter, an ohmic junction is formed between the metal film and the silicon carbide substrate by annealing; on the surface, a layer is formed that is highly cohesive with another metal film and that is highly resistant against any physical method such as Ar sputtering; the substance causing peeling-off and generated during the formation of the ohmic electrode is removed with priority using Ar sputtering; thereby, a surface is exposed that is highly cohesive with another metal film; and thereby, the cohesion is improved between the exposed metal wiring film for the connection and an external apparatus.

Means for Solving Problem

The inventors actively studied to achieve an object and as a result, found that, when an element not reactive with carbon such as Ni is used in a first metal layer to obtain an ohmic junction between the first metal layer and a silicon carbide substrate: the first metal layer is formed with a metal of the group IV, V, or VI that reacts with carbon to produce a compound; and thereby, after executing heat treatment therefor at a temperature equal to or higher than 1,100 degrees C., graphite that induces the peeling off is reduced and a highly adhesive material is formed on the first metal layer. The inventors further found that: among the metals of the group IV, V, or VI, especially, titanium (Ti) formed three-element compounds with titanium silicide, titanium carbide, and titanium, silicon, and carbon (TixSiyCz); and these compounds were resistant against the physical methods and therefore, achieved an effect of suppressing the peeling off of the metal wiring film.

Based on this knowledge, the present invention reaches completion and according to the present invention, the following inventions are provided.

To solve the problems above and achieve an object, a fabrication method of a silicon carbide semiconductor apparatus according to the present invention has the following characteristics. A silicon carbide substrate of a first conductivity type is prepared (A); an epitaxial layer of the first conductivity type is formed on one principal surface of the silicon carbide substrate (B). On another principal surface of the silicon carbide substrate, a first metal layer is formed including nickel (Ni) and any one or more of metals of a group IV, V, or VI (C). Heat treatment is executed for the silicon carbide substrate to form an ohmic junction between the first metal layer and the other principal surface of the silicon carbide substrate, and a layer of a substance highly cohesive with another metal on the first metal layer (D). Impurities on a surface of the first metal layer on the other principal surface of the silicon carbide substrate are removed to clean the surface (E). The heat treatment at process (D) of forming the layer of the substance highly cohesive with another metal on the first metal layer is executed at a temperature of 1,100 degrees C. or more.

In the fabrication method of a silicon carbide semiconductor apparatus according to the present invention, the first metal layer is a layer of nickel (Ni) and titanium (Ti).

In the fabrication method of a silicon carbide semiconductor apparatus according to the present invention, a highest temperature for the heat treatment at process (D) of forming the layer of the substance highly cohesive with another metal is 1,100 degrees C. or more and 1,350 degrees C. or less.

In the fabrication method of a silicon carbide semiconductor apparatus according to the present invention, a time period for maintaining the heat treatment at process (D) of forming the layer of the substance highly cohesive with another metal is one second or more and one hour or less.

In the fabrication method of a silicon carbide semiconductor apparatus according to the present invention, a temperature increase rate of the heat treatment at process (D) of forming the layer of the substance highly cohesive with another metal is 0.5 degrees C./second or more and 20 degrees C./second or less.

In the fabrication method of a silicon carbide semiconductor apparatus according to the present invention, the layer of the substance highly cohesive with another metal is formed by a layer partially remaining on the first metal layer.

In the fabrication method of a silicon carbide semiconductor apparatus according to the present invention, the layer of the substance highly cohesive with another metal is formed by a three-element compound including titanium carbide or titanium, and silicon and carbon (TixSiyCz).

In the fabrication method of a silicon carbide semiconductor apparatus according to the present invention, at process (E) of removing and cleaning up impurities on a surface of the first metal layer on the other principal surface of the silicon carbide substrate, a bias sputtering method of removing impurities and cleaning up by causing ions to collide therewith is used.

In the fabrication method of a silicon carbide semiconductor apparatus according to the present invention, the ions are ionized argon (Ar).

In the fabrication method of a silicon carbide semiconductor apparatus according to the present invention, between process (D) of forming the layer of the substance highly cohesive with another metal and process (E) of removing and cleaning up impurities on a surface of the first metal layer on the other principal surface of the silicon carbide substrate, a process (F) of forming a second metal layer on the epitaxial layer of the one principal surface of the silicon carbide substrate.

In the fabrication method of a silicon carbide semiconductor apparatus according to the present invention, a Schottky junction is formed between the second metal layer and the epitaxial layer by executing heat treatment for the silicon carbide substrate at a temperature of 1,000 degrees C. or less (G).

In the fabrication method of a silicon carbide semiconductor apparatus according to the present invention, a highest temperature of the heat treatment at process (G) of forming the Schottky junction is 400 degrees C. or more and 600 degrees C. or less.

In the fabrication method of a silicon carbide semiconductor apparatus according to the present invention, a time period for maintaining the heat treatment at process (G) of forming the Schottky junction is one minute or longer and 30 minutes or less.

In the fabrication method of a silicon carbide semiconductor apparatus according to the present invention, a temperature increase rate of the heat treatment at process (G) of forming the Schottky junction is 1 degree C./second or greater and 10 degrees C./second or less.

In the fabrication method of a silicon carbide semiconductor apparatus according to the present invention, between process (B) of forming the epitaxial layer of the first conductivity type (B) and process (C) of forming the first metal layer (C), a process (H) of selectively forming a second conductivity type region in a region to be a lower portion of a region having the second metal layer formed therein of the epitaxial layer.

In the fabrication method of a silicon carbide semiconductor apparatus according to the present invention, at process (H) of selectively forming the second conductivity type region, the second conductivity type region is disposed in a stripe-like layout.

In the fabrication method of a silicon carbide semiconductor apparatus according to the present invention, the epitaxial layer is formed on a (0001) surface of the silicon carbide substrate.

In the fabrication method of a silicon carbide semiconductor apparatus according to the present invention, the epitaxial layer is formed on a (000-1) surface of the silicon carbide substrate.

A silicon carbide semiconductor apparatus according to the present invention is a silicon carbide semiconductor apparatus fabricated by the fabrication method above and has the following characteristics. The rate of carbon atoms each having a bond with any one of metals of the group IV, V, or VI is 20% or greater in the layer of the substance highly cohesive with another metal formed on the first metal layer.

In the silicon carbide semiconductor apparatus according to the present invention, the rate of carbon atoms each having a Ti—C bond is 20% or more.

Effect of the Invention

According to the present invention, a semiconductor apparatus having a stable structure without the occurrence of peeling off can be provided by, in the process of fabricating the silicon carbide semiconductor apparatus: suppressing formation of the substance causing peeling-off such as graphite that causes the peeling off of the metal wiring film; forming on the surface, a substance highly cohesive with another metal; and thereby, improving the cohesion between an external apparatus and the metal wiring film for the connection.

BEST MODE(S) FOR CARRYING OUT THE INVENTION

Figure 1A:
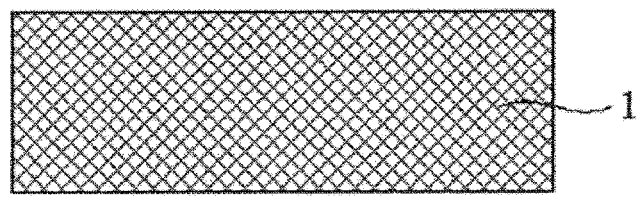
FIG. 1A is a cross-sectional diagram of an example of a fabrication process of a silicon carbide semiconductor apparatus of the present invention.

A method of fabricating a silicon carbide semiconductor of the present invention, includes process (A) of preparing a silicon carbide substrate of a first conductivity type, process (B) of forming an epitaxial layer of the first conductivity type on one principal surface of the silicon carbide substrate of the first conductivity type, process (C) of forming a first metal layer including nickel (Ni) and any one or more of the metals of the group IV, V, or VI on the other principal surface of the silicon carbide substrate of the first conductivity type, process (D) of executing heat treatment for the silicon carbide substrate after process (C) to form an ohmic junction between the first metal layer and the other principal surface of the silicon carbide substrate and to form a layer of a substance highly cohesive with another metal on the first metal layer, and process (E) of removing impurities on the surface of the first metal layer on the other principal surface of the silicon carbide substrate to clean up the surface; and is characterized in that the heat treatment at process (D) is executed at a temperature equal to or higher than 1,100 degrees C.

In the present invention, the first metal layer on the other principal surface of the silicon carbide substrate: includes nickel (Ni) and any one or more of the metals of the group IV, V, or VI; and has these metals mixed therein evenly or unevenly, or has therein layers of various forms. In the present invention: the metals of the group IV constituting the first metal layer together with Ni can be titanium (Ti), zirconium (Zr), etc.; metals of the group V can be vanadium (V), tantalum (Ta), etc.; and metals of the group VI can be chromium (Cr), molybdenum (Mo), tungsten (W), etc.

In the first metal layer on the other principal surface of the silicon carbide substrate, the mixing form is varied by the heat treatment to form the first metal layer obtained after the heat treatment. A layer of the substance highly cohesive with another metal and highly resistant against any physical method such as Ar sputtering (hereinafter, referred to as "layer of the substance highly cohesive with another metal") is formed on the surface of the first metal layer after heat treatment and, on this layer, a substance is formed that is poorly adhesive and that is easily removed by any physical method. Thereafter, plural process steps are executed and, thereafter, a substance causing the peeling off is further deposited. After this surface is processed by a physical method, only the layer of the substance highly resistant and highly cohesive with another metal remains and therefore, no peeling off occurs even when a metal is deposited. Therefore, preferably, the removal of the impurities is executed immediately before the deposition of the other metal.

In the present invention, when an element not reactive with carbon such as Ni is used in the first metal layer to obtain the ohmic junction between the first metal layer and the other principal surface of the silicon carbide substrate, graphite inducing the peeling off is reduced on the first metal layer after the heat treatment is executed therefor at a temperature equal to or higher than 1,100 degrees C. and the highly cohesive substance is formed, by forming the first metal layer using a metal of the group IV, V, or VI and that reacts with carbon to produce a compound. Therefore, the usage of the element is effective. Among the metals of the group IV, V, or VI, especially, Ti forms three-element compounds with titanium silicide, titanium carbide, and titanium, silicon, and carbon (Ti$_x$Si$_y$C$_z$). These compounds are resistant against any physical method and achieves an effect of suppressing the peeling off of the other metal film such as, for example, the metal wiring film.

In the present invention, as to the highest temperature of the heat treatment (annealing) temperature, a temperature equal to or higher than 1,100 degrees C. and equal to or lower than 1,350 degrees C. achieves the effect of forming the substance that is highly resistant against any physical method and that suppresses the peeling off of the other metal film. As to the time period to maintain the heat treatment condition, a time period equal to or longer than one second and equal to or shorter than one hour achieves the effect of forming the substance that is highly resistant against any physical method and that suppresses the peeling off. As to the temperature increase rate of the heat treatment condition, a rate equal to or higher than 0.5 degrees C./second and equal to or lower than 20 degrees C./second achieves the effect of forming the substance that is highly resistant against any physical method and that suppresses the peeling off of the other metal film.

In the present invention, even when the layer made of the substance that is highly resistant against any physical method and that suppresses the peeling off of the other metal film is the layer that partially remains on the surface of the first metal layer, the effect is also achieved.

In the present invention, as to the method of removing the impurities and cleaning up, a bias sputtering method of removing the impurities and cleaning up by causing ions to collide therewith achieves the effect of removing the substance causing peeling-off with priority and, preferably, among others, the bias sputtering method of removing the impurities and cleaning up by causing Ar ions to collide therewith is employed.

In the present invention, the effect is also achieved even when: the ohmic junction is formed between the first metal layer and the other principal surface of the silicon carbide substrate; thereafter, a process is executed of forming a structure such as a Schottky barrier diode (SBD) on the one principal surface of the silicon carbide substrate; and, thereafter, the step is executed of removing the impurities on the surface of the first metal layer, and cleaning up, on the other principal surface of the silicon carbide substrate. The effect is achieved with the other principal surface of the silicon carbide substrate that is any one of a (0001) surface and a (000-1) surface. In the notation of the Miller's index used herein, "-" means a bar attached to an index immediately thereafter, and attaching "-" to an index therebefore represents that the index is a negative index.

Embodiments of the present invention will be described below in detail with reference to the accompanying drawings. However, the present invention is not limited to the embodiments and various design modifications can be made thereto without departing from the spirit of the present invention. Though it is assumed in the embodiments that the first conductivity type is the n-type and the second conductivity type is the p-type, the present invention is also established when it is assumed that the first conductivity type is the p-type and the second conductivity type is the n-type.

First Embodiment

A first embodiment will first be described. FIGS. 1A, 1B, 1C, 1D, 1E, 1F and 1G are cross-sectional diagrams of an example of a fabrication process of a silicon carbide semiconductor apparatus in the first embodiment of the present invention.

Figure 1B:
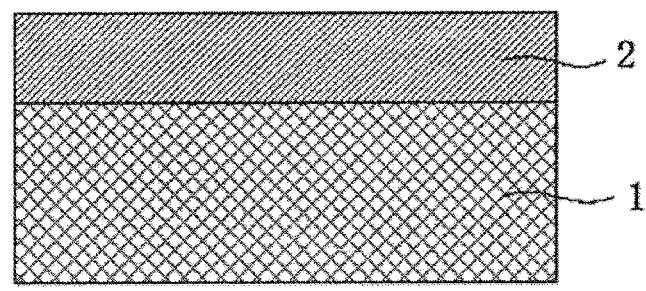
FIG. 1B is a cross-sectional diagram of the example of the fabrication process of a silicon carbide semiconductor apparatus of the present invention.

As depicted in FIG. 1A, a high-concentration n-type substrate (a silicon carbide substrate) 1 is prepared doped with nitrogen at, for example, $5 \times 10^{18}$ cm$^{-3}$, having a thickness of, for example, 350 μm, and having a (0001) surface as its principal surface. As depicted in FIG. 1B, a low-concentration n-type drift layer 2 doped with nitrogen at, for example, $1.0 \times 10^{16}$ cm$^{-3}$ and having a thickness of, for example, 10 μm is deposited on the principal surface of the silicon carbide substrate 1. Thereby, a semiconductor substrate is formed having the low-concentration n-type drift layer 2 deposited on the silicon carbide substrate 1. Hereinafter, the face on the side of the low-concentration n-type drift layer 2 of the semiconductor substrate will be referred to as "front face" and the face on the side of the silicon carbide substrate 1 (the other principal surface of the silicon carbide substrate 1) will be referred to as "back face".

Figure 1C:
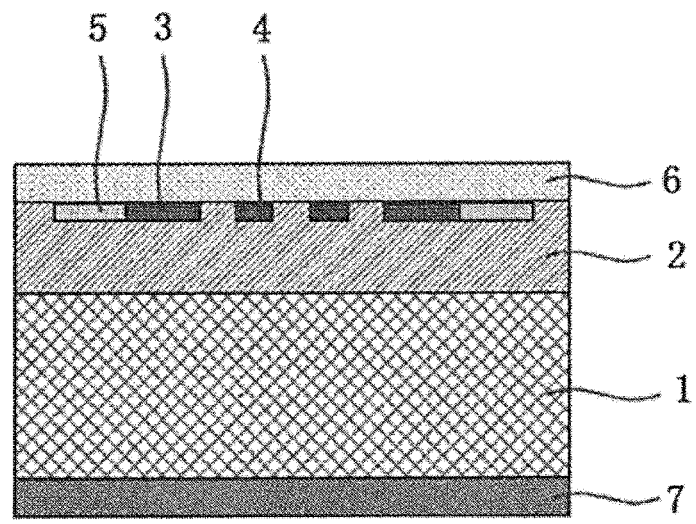
FIG. 1C is a cross-sectional diagram of the example of the fabrication process of a silicon carbide semiconductor apparatus of the present invention.

As depicted in FIG. 1C, aluminum (Al) is injected from the substrate front face by, for example, an ion implantation apparatus to selectively form, in the surface layer of the low-concentration n-type drift layer 2 (the surface layer of the substrate front face), a p-type region 3 for a termination structure, a p-type region 4 for a junction barrier Schottky (JBS) structure, and a p-type region 5 for a junction termination extension (JTE) structure. An activation process is executed, for example, for 240 seconds at a temperature of 1,650 degrees C. in an Ar atmosphere to activate the aluminum injected to form the p-type region 3 for the termination structure, the p-type region 4 for the JBS structure, and the p-type region 5 for the JTE structure. The p-type region 4 for the JBS structure may have a stripe-like planar layout for the plural p-type regions 4 for the JBS structures to extend in a direction perpendicular to the direction for the plural p-type regions 4 for the JBS structures to line up side by side. By disposing the p-type region 4 for the JBS structure in this planar layout, when an inverse voltage is applied, a depletion layer is expanded to alleviate the concentration of the electric field and the withstand voltage is improved compared to a simple SBD structure; and, in addition, an avalanche breakdown tends to occur in the interface between the p-type region 4 and the n-type drift layer 2 and the avalanche tolerance amount can also be improved. Thereafter, to remove a surface contamination layer caused by the activation process, a thermally oxidized film having a thickness of, for example, 50 nm is formed to execute the removal. An interlayer insulation film 6 having a thickness of, for example, 0.5 μm is formed on the low-concentration n-type drift layer 2.

As depicted in FIG. 1C, for example, a Ni film having a thickness of 50 nm and a Ti film having a thickness of 10 nm are deposited as a first metal layer 7 on the other principal surface of the silicon carbide substrate 1. Thereafter, heat treatment is executed using, for example, a rapid thermal anneal (RTA) apparatus. For example, the temperature is increased at a temperature increase rate of 1 degree C./second and, when the temperature reaches 900 to 1,300 degrees C., this temperature is maintained for two minutes as a condition for the heat treatment.

Figure 1D:
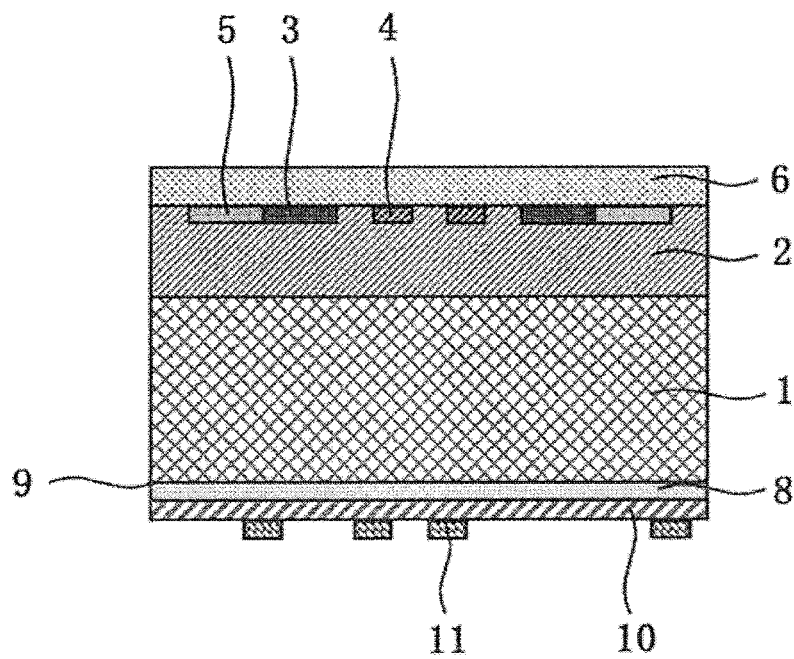
FIG. 1D is a cross-sectional diagram of the example of the fabrication process of a silicon carbide semiconductor apparatus of the present invention.

Thereby, the first metal layer 7 depicted in FIG. 1C is converted into silicide and forms a first metal layer 8 whose form has changed as depicted in FIG. 1D, and a low-resistance ohmic contact 9 is formed between the other principal surface of the silicon carbide substrate 1 and the first metal layer 8. Ti in the Ti film, and Si and carbon in the silicon carbide substrate 1 react with each other and thereby, a layer 10 of a substance highly cohesive with another metal is formed by any one of or a combination of the three-element compounds of Ti silicide (TiSi), Ti carbide (TiC), and Ti and Si (Ti$_x$Si$_y$C$_z$). For example, under a condition that the temperature of the heat treatment is low, etc., residual carbon 11 that does not react with Ti may remain in the surface of the first metal layer 8 after the heat treatment.

Figure 1E:
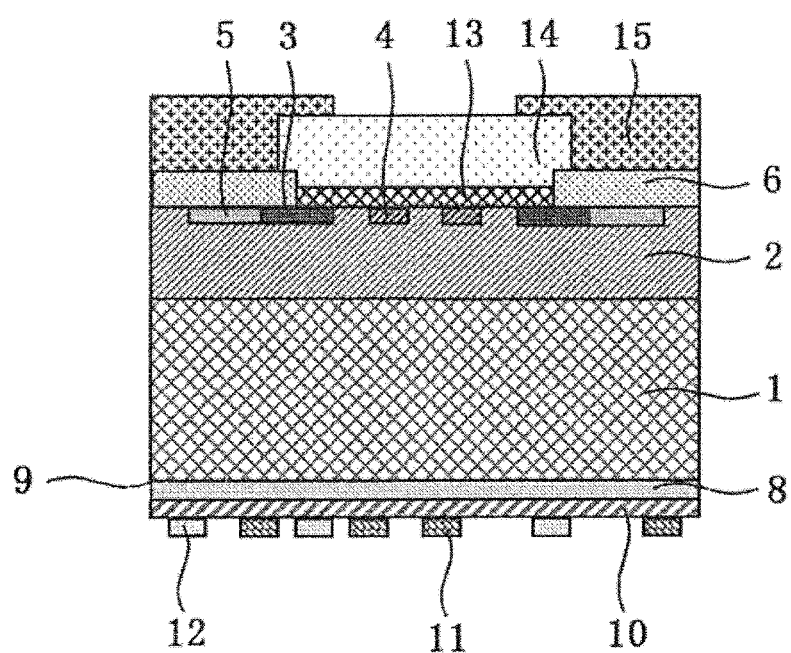
FIG. 1E is a cross-sectional diagram of the example of the fabrication process of a silicon carbide semiconductor apparatus of the present invention.

The process steps to be executed thereafter are not depicted. However, to fabricate, for example, a vertical SBD, many process steps are executed to fabricate a structure such as a Schottky contact on the opposite side of the face implementing the present invention thereon (front principal surface of the substrate). For example, as depicted in FIG. 1E, the low-concentration n-type drift layer 2 and a second metal layer 13 having therein the Schottky junction are formed using, for example, Ti. The temperature is increased in a temperature increase time period of, for example, 8 degrees C./second and, after the temperature reaches, for example, 500 degrees C., the temperature is maintained for five min to form the Schottky junction. The highest temperature of the heat treatment (annealing) temperature is equal to or lower than 1,000 degrees C. and, preferably, is equal to or higher than 400 degrees C. and equal to or lower than 600 degrees C., and the time period to maintain the heat treatment condition is equal to or longer than one minute and equal to or shorter than 30 minutes. Preferably, the temperature increase rate of the heat treatment condition is equal to or higher than 1 degree C./second and equal to or lower than 10 degrees C./second. The reason for this is that the variations of the forward rise voltage can be suppressed within a small range that is within 10% from the central value by treating the substrate within the above ranges of the condition.

Thereafter, a third metal layer 14 is formed using Al—Si having a thickness of, for example, 5 μm as a bonding electrode pad on the second metal layer 13, and a polyimide 15 is formed on the interlayer insulation film 6 such that the polyimide 15 extends on the third metal layer 14. Therefore, as depicted in FIG. 1E, a substance causing peeling-off 12 formed by contamination occurring during the execution of these many process steps, for example, the residue of the photoresist is added to the surface of the other principal surface of the silicon carbide substrate 1.

Figure 1F:
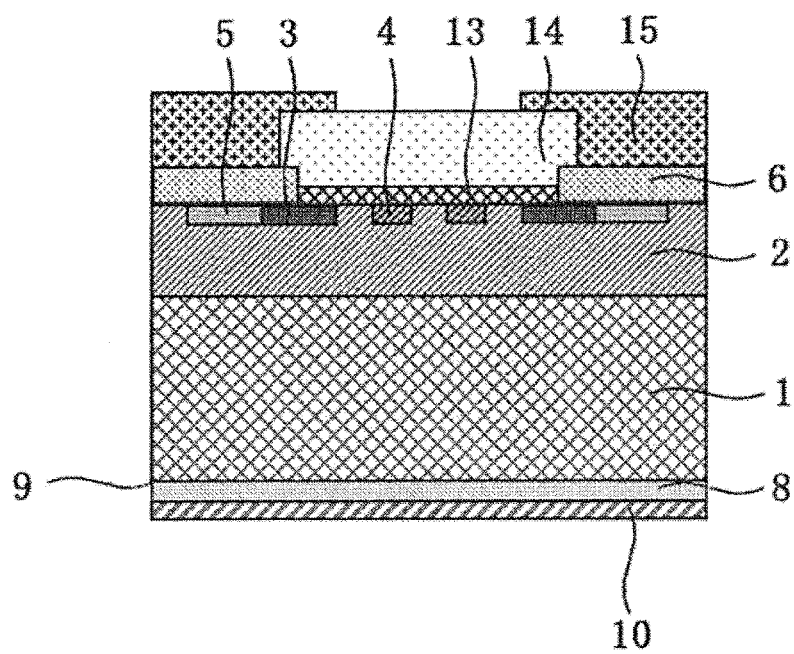
FIG. 1F is a cross-sectional diagram of the example of the fabrication process of a silicon carbide semiconductor apparatus of the present invention.

When the back face is processed using, for example, the bias sputtering method to remove the impurities and clean up by causing ionized argon (Ar) to collide therewith, as depicted in FIG. 1F, the layer 10 of the substance highly cohesive with other metals appears on the surface of the back face of the substrate. [0052]

Figure 1G:
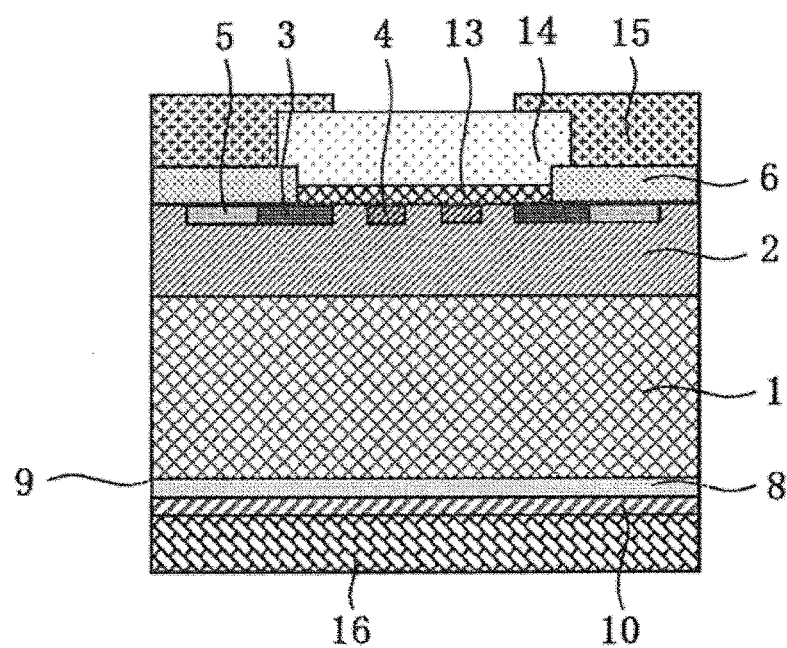
FIG. 1G is a cross-sectional diagram of the example of the fabrication process of a silicon carbide semiconductor apparatus of the present invention.
Figure 2:
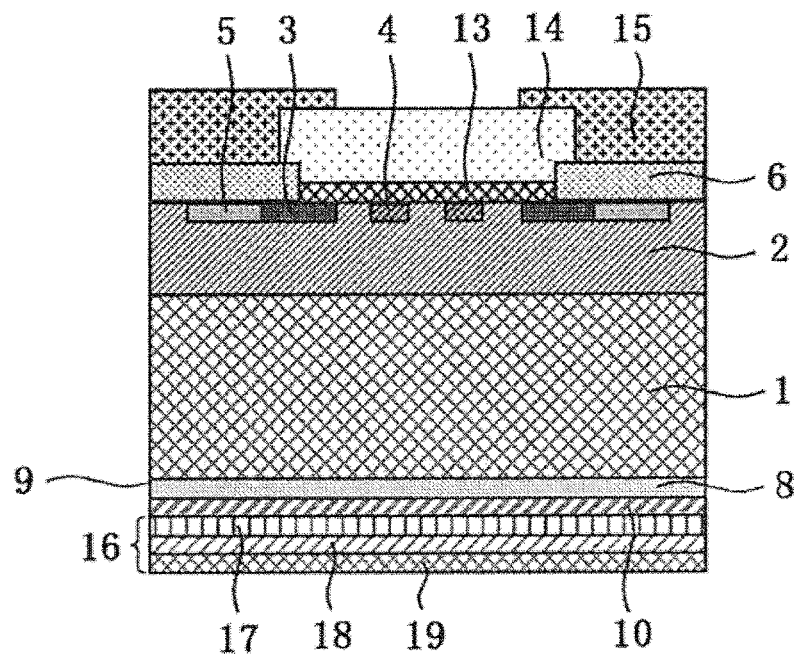
FIG. 2 is a cross-sectional diagram of a semiconductor apparatus using a Ti film, a Ni film, and an Au film, according to a first embodiment of the present invention.

When the layer 10 of the substance highly cohesive with other metals is exposed on the surface immediately after the cleaning-up process for the back face of the substrate, a fourth metal layer 16 is formed on the layer 10 of the substance highly cohesive with other metals as depicted in FIG. 1G. FIG. 2 is a cross-sectional diagram of the semiconductor apparatus using a Ti film, a Ni film, and an Au film as the fourth metal layer 16 to be the metal wiring film in the first embodiment of the present invention. For example, as depicted in FIG. 2, when the Ti film 17 is formed to have a thickness of, for example, 100 nm, the Ni film 18 is formed to have a thickness of, for example, 500 nm, and the Au film 19 is formed to have a thickness of, for example, 200 nm each in a vacuum using a deposition apparatus, these films constitute the fourth metal layer 16 that is for the connection to an external apparatus and that does not peel off and whose resistance is low.

Figure 3:
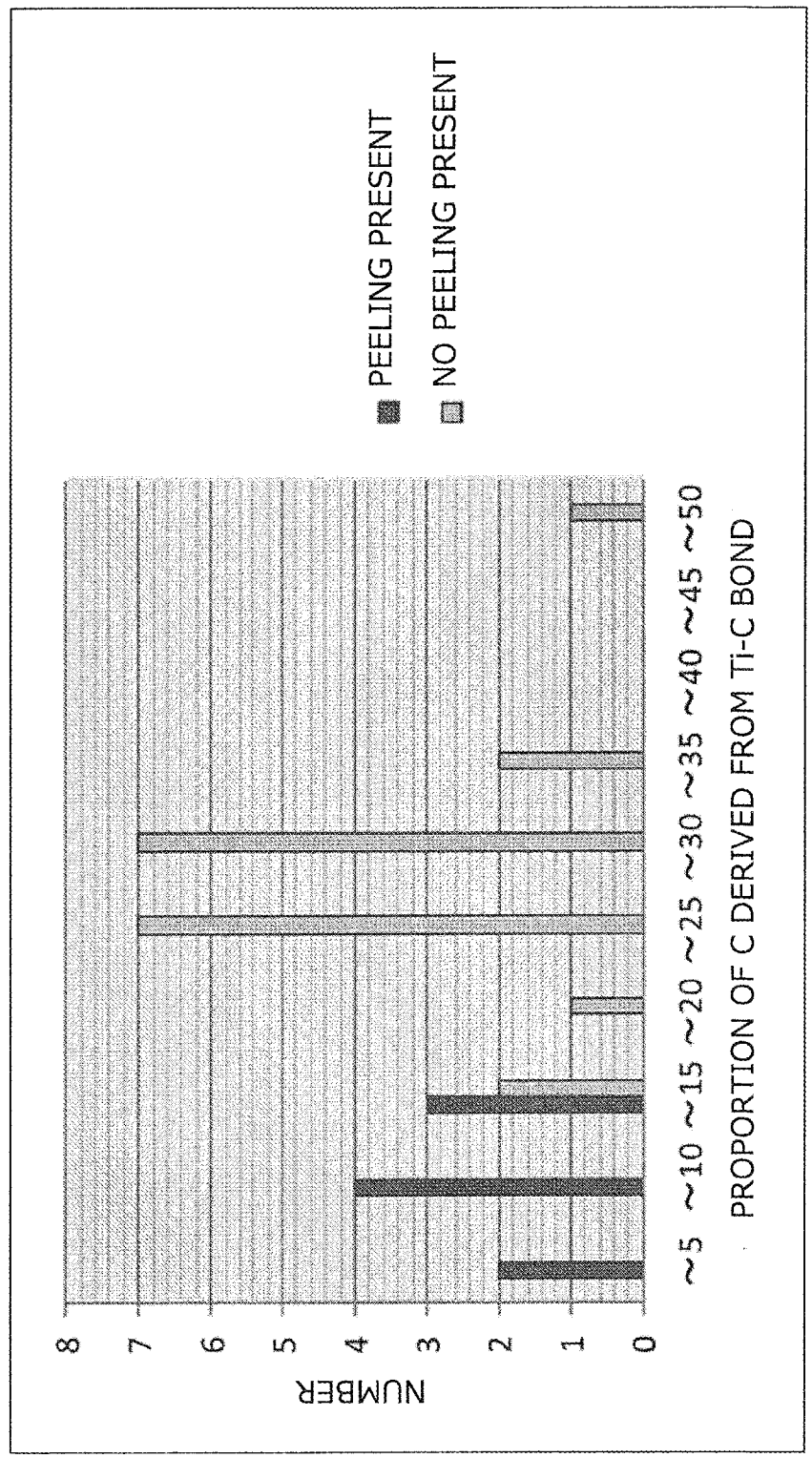
FIG. 3 is a property diagram depicting the relation between the rate of Ti carbide that is a substance having a Ti—C bond state and cohesion in the first embodiment of the present invention.

To investigate the cause of the peeling off, the inventors measured the layer 10 of the substance highly cohesive with other metals in a silicon carbide semiconductor apparatus often suffering the peeling off and a silicon carbide semiconductor apparatus suffering no peeling off, using the ESCA. FIG. 3 is a property diagram depicting the relation between the rate of Ti carbide that is a substance having a Ti—C bond state and the cohesion in the first embodiment of the present invention. As depicted in FIG. 3, the inventors were able to confirm that the peeling off of the fourth metal layer 16 did not occur when the rate of the carbon atoms each having the Ti—C bond was equal to or higher than 20% of all the atoms in the layer 10 of the substance highly cohesive with other metals.

Figure 4:
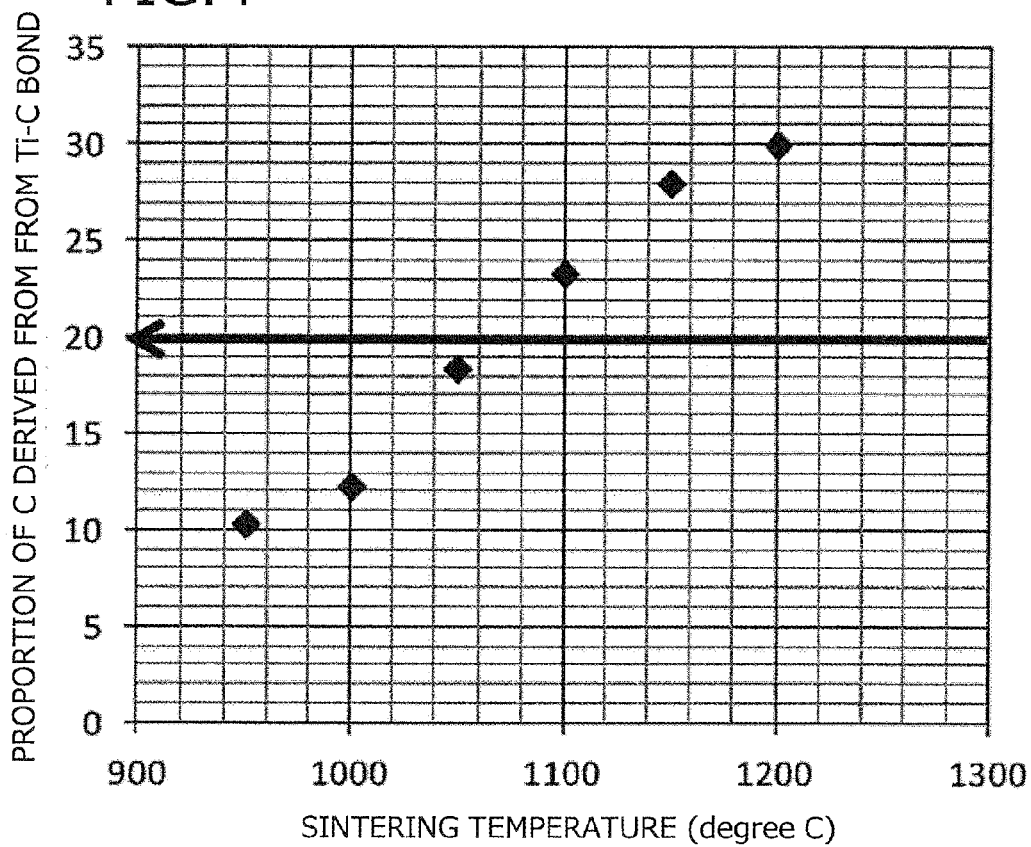
FIG. 4 is a property diagram of the relation between the rate of Ti carbide that is the substance having the Ti—C bond and sintering temperature (degree C.) in the first embodiment of the present invention.

As a result of further investigation, the rate of the carbon atoms each having the Ti—C bond is related to the temperature of the heating (sintering) in the process step depicted in FIG. 1D. FIG. 4 is a property diagram of the relation between the rate of Ti carbide that is the substance having the Ti—C bond and the sintering temperature (degree C.) in the first embodiment of the present invention. As depicted in FIG. 4, the rate of the carbon atoms each having the Ti—C bond is equal to or higher than 20% when the sintering temperature is equal to or higher than 1,100 degrees C.

Thereby, it can be stated that any one of or a mixture of the three-element compounds of TiC having the Ti—C bond, Ti, Si, and carbon ($Ti_xSi_yC_z$) is the highly cohesive substance and can form the highly cohesive layer by sintering at 1,100 degrees C. or higher.

Figure 5:
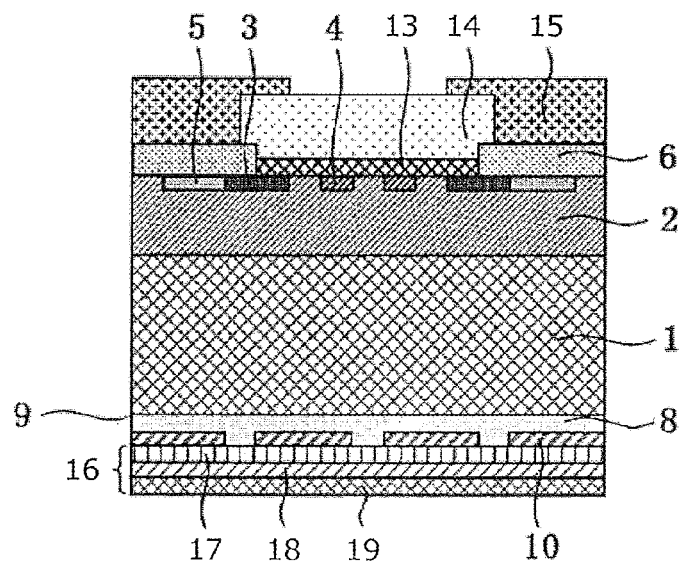
FIG. 5 is a cross-sectional diagram of the semiconductor apparatus when a partially remaining layer is formed as a layer of a substance highly cohesive with other metals in the first embodiment of the present invention.

Although Ti is used as the metal that reacts with carbon to produce the compound in this embodiment, it is envisaged that the same effect can also be achieved by using a metal of the group IV, V, or VI other than Ti. FIG. 5 is a cross-sectional diagram of the semiconductor apparatus at the time when the partially remaining layer is formed as the layer of the substance highly cohesive with other metals in the first embodiment of the present invention. As depicted in FIG. 5, it can be stated that the layer 10 of the substance highly cohesive with other metals is still effective when this layer 10 partially remains based on the abundance ratio of the layer 10 of the substance highly cohesive with other metals.

Second Embodiment

A case where the SBD apparatus is fabricated is described in the first embodiment. However, on the substrate front face, another apparatus, for example, a front face structure such as a MOS gate (an insulated gate consisting of a metal/an oxide film/a semiconductor) can be manufactured. The configuration of the silicon carbide semiconductor apparatus according to a second embodiment except the front face structure is same as that of the silicon carbide semiconductor apparatus according to the first embodiment. Therefore, according to the fabrication process of the silicon carbide semiconductor apparatus according to the second embodiment, for example, a MOS gate merely has to be formed when the front face structure is formed in the fabrication process of the silicon carbide semiconductor apparatus according to the first embodiment.

Third Embodiment

In the first embodiment, the description is made taking the example of the (0001) surface as the principal surface of the silicon carbide substrate 1. However, the (000-1) surface may be used as the principal surface of the silicon carbide substrate 1. The configuration of the silicon carbide semiconductor apparatus according to a third embodiment, excluding the silicon carbide substrate 1, is same as that of the silicon carbide semiconductor apparatus according to the first embodiment. Therefore, according to the fabrication process of the silicon carbide semiconductor apparatus according to the third embodiment, a silicon carbide substrate 1 having the (000-1) surface as the principal surface merely has to be used in the fabrication process of the silicon carbide semiconductor apparatus according to the first embodiment.

In the first embodiment, the description is made with reference to the cross-sectional diagram depicting the state where the electrode is formed evenly on the overall substrate surface. However, the present invention can be caused to support a contact of a silicon carbide semiconductor apparatus having an electrode formed partially on the surface of the substrate principal surface, for example, a merged pin and Schottky barrier (MPS) structure diode.

INDUSTRIAL APPLICABILITY

As described, the method of fabricating the silicon carbide semiconductor apparatus according to the present invention and the silicon carbide semiconductor apparatus manufactured according to the method are useful for a semiconductor apparatus including an ohmic junction between a metal film and a silicon carbide substrate.

EXPLANATIONS OF LETTERS OR NUMERALS 1 first conductivity type silicon carbide substrate
2 first conductivity type silicon carbide epitaxial layer
3 second conductivity type impurity ion implanted region (JBS)
4 second conductivity type impurity ion implanted region (termination)
5 second conductivity type impurity ion implanted region (JTE)
6 interlayer insulation film
7 first metal layer
8 first metal layer after the heat treatment
9 ohmic junction
10 layer of the substance highly adhesive with another metal
11 unreacted remaining carbon
12 substance causing peeling-off adhered during the process steps
13 second metal layer (Schottky junction metal)
14 third metal layer (electrode pad)
15 polyimide
16 fourth metal layer
17 Ti layer
18 Ni layer
19 Au layer

The invention claimed is:

1. A method of fabricating a silicon carbide semiconductor apparatus, comprising:
a process (A) of preparing a silicon carbide substrate of a first conductivity type;
a process (B) of forming an epitaxial layer of the first conductivity type on one principal surface of the silicon carbide substrate;
a process (C) of forming on another principal surface of the silicon carbide substrate, a first metal layer including nickel (Ni) and any one or more of metals of a group IV, V, or VI;
a process (D) of executing heat treatment for the silicon carbide substrate after the process (C) to form an ohmic junction between the first metal layer and the other principal surface of the silicon carbide substrate, and a layer of a substance highly cohesive with another metal on the first metal layer; and
a process (E) of removing impurities and cleaning a surface of the first metal layer on the other principal surface of the silicon carbide substrate after the process (D), wherein
the heat treatment at the process (D) is executed at a temperature of 1,120 degrees C. or more; and
a time period for maintaining the heat treatment at the process (D) is one second or more and one hour or less.

2. The method of fabricating a silicon carbide semiconductor apparatus according to claim 1, wherein
the first metal layer is a layer of nickel (Ni) and titanium (Ti).

3. The method of fabricating a silicon carbide semiconductor apparatus according to claim 1, wherein
a highest temperature for the heat treatment at the process (D) is 1,100 degrees C. or more and 1,350 degrees C. or less.

4. The method of fabricating a silicon carbide semiconductor apparatus according to claim 1, wherein
a temperature increase rate of the heat treatment at the process (D) is 0.5 degrees C./second or more and 20 degrees C./second or less.

5. The method of fabricating a silicon carbide semiconductor apparatus according to claim 1, wherein
the layer of the substance highly cohesive with another metal is formed by a layer partially remaining on the first metal layer.

6. The method of fabricating a silicon carbide semiconductor apparatus according to claim 1, wherein
the layer of the substance highly cohesive with another metal is formed by a three-element compound including titanium carbide or titanium, and silicon and carbon ($Ti_xSi_yC_z$).

7. The method of fabricating a silicon carbide semiconductor apparatus according to claim 1, wherein
at the process (E), a bias sputtering method of removing impurities and cleaning up by causing ions to collide therewith is used.

8. The method of fabricating a silicon carbide semiconductor apparatus according to claim 7, wherein
the ions are ionized argon (Ar).

9. The method of fabricating a silicon carbide semiconductor apparatus according to claim 1, further comprising
between the processes (D) and (E), a process (F) of forming a second metal layer on the epitaxial layer of the one principal surface of the silicon carbide substrate.

10. The method of fabricating a silicon carbide semiconductor apparatus according to claim 9, further comprising
a process (G) of forming a Schottky junction between the second metal layer and the epitaxial layer by executing heat treatment for the silicon carbide substrate at a temperature of 1,000 degrees C. or less.

11. The method of fabricating a silicon carbide semiconductor apparatus according to claim 10, wherein
a highest temperature of the heat treatment at the process (G) is 400 degrees C. or more and 600 degrees C. or less.

12. The method of fabricating a silicon carbide semiconductor apparatus according to claim 10, wherein
a time period for maintaining the heat treatment at the process (G) is one minute or longer and 30 minutes or less.

13. The method of fabricating a silicon carbide semiconductor apparatus according to claim 10, wherein
a temperature increase rate of the heat treatment at the process (G) is 1 degree C./second or greater and 10 degrees C./second or less.

14. The method of fabricating a silicon carbide semiconductor apparatus according to claim 9, further comprising
between the processes (B) and (C), a process (H) of selectively forming a second conductivity type region in a region to be a lower portion of a region having the second metal layer formed therein of the epitaxial layer.

15. The method of fabricating a silicon carbide semiconductor apparatus according to claim 14, wherein
at the process (H), the second conductivity type region is disposed in a stripe-like layout.

16. The method of fabricating a silicon carbide semiconductor apparatus according to claim 1, wherein
the epitaxial layer is formed on a (0001) surface of the silicon carbide substrate.

17. The method of fabricating a silicon carbide semiconductor apparatus according to claim 1, wherein
the epitaxial layer is formed on a (000-1) surface of the silicon carbide substrate.

18. A silicon carbide semiconductor apparatus manufactured according to the method of fabricating according to claim 1, wherein
a rate of carbon atoms each having a bond with any one of metals of the group IV, V, or VI is 25% or greater of all the atoms in the layer of the substance highly cohesive with another metal formed on the first metal layer.

19. The silicon carbide semiconductor apparatus according to claim 18, wherein
a rate of carbon atoms each having a Ti—C bond is 25% or more of all the atoms.

* * * * *